United States Patent
Sampath et al.

(10) Patent No.: US 11,800,693 B1
(45) Date of Patent: Oct. 24, 2023

(54) REVERSIBLE SERVER SYSTEM

(71) Applicant: Amazon Technologies, Inc., Seattle, WA (US)

(72) Inventors: Shreyas Sampath, Kirkland, WA (US); Darin Lee Frink, Lake Tapps, WA (US); Bianca Nagy, Redmond, WA (US)

(73) Assignee: Amazon Technologies, Inc., Seattle, WA (US)

(*) Notice: Subject to any disclaimer, the term of this patent is extended or adjusted under 35 U.S.C. 154(b) by 90 days.

(21) Appl. No.: 17/491,310

(22) Filed: Sep. 30, 2021

(51) Int. Cl.
*H05K 7/14* (2006.01)
*H05K 7/20* (2006.01)

(52) U.S. Cl.
CPC ....... *H05K 7/20836* (2013.01); *H05K 7/1489* (2013.01); *H05K 7/1494* (2013.01); *H05K 7/20145* (2013.01); *H05K 7/20736* (2013.01)

(58) Field of Classification Search
CPC .. H05K 7/1487; H05K 7/1489; H05K 7/1494; H05K 7/20145; H05K 7/20736; H05K 7/20836; H05K 7/20209; H05K 7/20727; H05K 5/0208; G06F 1/20; G06F 1/206; G06F 21/572; G05D 3/12
See application file for complete search history.

(56) References Cited

U.S. PATENT DOCUMENTS

| | | | | |
|---|---|---|---|---|
| 6,567,275 B1* | 5/2003 | Hou | ...................... | H05K 5/0021 361/740 |
| 7,408,774 B1* | 8/2008 | Anderl | ...................... | G06F 1/20 415/60 |
| 7,675,747 B1 | 3/2010 | Ong et al. | | |
| 7,983,039 B1* | 7/2011 | Nguyen | .............. | H05K 7/20727 361/695 |
| 8,068,340 B1* | 11/2011 | Nguyen | .............. | F04D 25/0613 174/547 |
| 8,379,410 B2 | 2/2013 | Kitten | | |
| 8,385,064 B1* | 2/2013 | Smith | ................ | H05K 7/20727 361/679.48 |
| 8,873,236 B1* | 10/2014 | Tamarkin | .............. | F04D 29/601 361/679.48 |
| 9,377,026 B2* | 6/2016 | Suzuki | ............... | H05K 7/20836 |
| 9,936,612 B2* | 4/2018 | Goulden | ............ | H05K 7/20836 |

(Continued)

OTHER PUBLICATIONS

U.S. Appl. No. 16/196,723, filed Nov. 20, 2018, Anthony Nicholas Liguori.

*Primary Examiner* — Adrian S Wilson
*Assistant Examiner* — Gage Crum
(74) *Attorney, Agent, or Firm* — Alexander A. Knapp; Kowert, Hood, Munyon, Rankin & Goetzel, P.C.

(57) ABSTRACT

A rack-mountable server system includes air moving systems, such as fans, to induce airflow inside a server chassis to remove heat generated by components of the server system. The air moving systems are configured to direct air from a cold aisle, through the chassis of the server system, and out to a hot aisle as exhausted air. The server system is configured to be mounted in racks that provide cooling air on either a front or rear side of the rack. Thus, the server system is able to be mounted in a rack in a reversible Input/Output (IO) orientation and can accommodate multiple airflow directions through the server chassis to conform to a hot aisle and cold aisle configuration used for a given rack at a given facility at which the server system is mounted.

20 Claims, 10 Drawing Sheets

(56) References Cited

U.S. PATENT DOCUMENTS

| | | | |
|---|---|---|---|
| 10,342,161 B2 | 7/2019 | Ross | |
| 2002/0014962 A1* | 2/2002 | Miglioli | G08B 13/22 |
| | | | 340/568.1 |
| 2006/0169789 A1* | 8/2006 | Barsun | H05K 7/20836 |
| | | | 236/49.3 |
| 2006/0179308 A1* | 8/2006 | Morgan | G06F 21/575 |
| | | | 713/168 |
| 2007/0076368 A1* | 4/2007 | Pike | G06F 1/20 |
| | | | 361/679.48 |
| 2008/0100992 A1* | 5/2008 | Fiora | G06F 1/18 |
| | | | 361/601 |
| 2015/0105009 A1* | 4/2015 | Alshinnawi | H05K 7/2029 |
| | | | 454/184 |
| 2016/0174409 A1* | 6/2016 | Mease | H05K 7/20172 |
| | | | 361/695 |
| 2019/0045667 A1* | 2/2019 | Ross | H05K 7/20718 |
| 2020/0383245 A1* | 12/2020 | Davidson | H05K 7/20836 |
| 2022/0039294 A1* | 2/2022 | Chang | H05K 7/20727 |

\* cited by examiner

REVERSIBLE SERVER SYSTEM

BACKGROUND

Computing devices, such as servers, are frequently mounted in racks with inlet air drawn into a chassis of the server from one side of the rack and exhaust air, that has cooled internal components of the server, exhausted from the chassis of the server on another side of the rack. For example, servers generally include a number of heat generating components, ranging from processors to power supply units, that produce waste heat. This waste heat may be removed using one or more fans that induce an airflow through a chassis of the server.

Also, servers frequently include display elements such as status lights, display screens, or other indicators mounted on one or both ends of the server. Additionally, servers frequently include ports for connecting cables or wires to one or both ends of the servers. Typically, servers are fabricated with a fixed configuration such that airflow flows through a chassis of the server in a fixed direction and such that display elements and ports are mounted in fixed locations on respective ends of the chassis of the server.

Figure 1A:
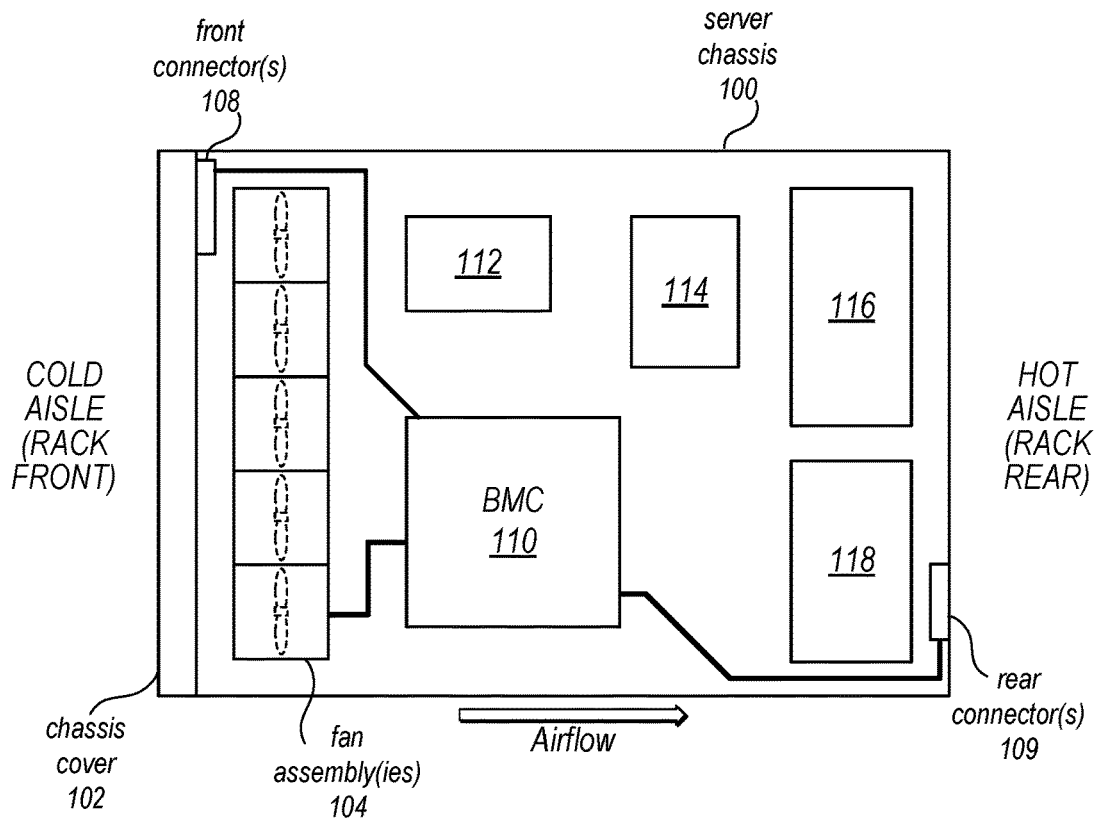
FIGS. 1A-1B illustrate a server system that allows reversible server Input/Output (IO) orientation in either of the front or rear of the server rack and accommodates multiple airflow directions inside the server chassis, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

Described herein are various embodiments of systems and methods to allow reversible server Input/Output (IO) orientation in either the front or the rear of a server rack and accommodate multiple airflow directions inside the server chassis. A typical server system may include numerous heat-producing components that require cooling to sustain operations of the server system. In some embodiments, cooling may be provided by air moving systems, such as a fan, to induce airflow inside a rack-mounted server chassis which removes heat as the air passes through the interior of the chassis. In order to efficiently remove heat from the various heat-producing components, the air moving systems direct the airflow from a cold air inlet side, such as a cold aisle in a data center. For example, the mechanical work done by the fans may force the cold air through the chassis and out to an exhaust air outlet side of the chassis, such as may be facing a hot aisle of a data center that heated air may be exhaust into. The cold aisle/hot aisle configuration of a data center conserves energy and lowers cooling costs by avoiding mixing exhaust air that has been heated by removing waste heat from computing devices with supply air that is yet to be used to remove waste heat from computing devices. For example, the cold air in the cold aisle is partitioned away from the warm air in the hot aisle. Leakage between the cold aisle and the hot aisle often results in loss of cooling efficiency for the data center.

In some instances, some data center operators may configure certain components of a computing device, such as ports, indicators, displays, etc., to face towards a cold aisle, while other data center operators may configure certain components, such as ports, indicators, displays, etc., to face towards a hot aisle. However, in some instances a computing device supplier or provider may desire to provide a single computing device that can be deployed into either type of data center, e.g. a data center that orients servers with connectors facing the cold aisle and another data center that orients servers with connectors facing the hot aisle. Because the IO connectors are typically fixed in a certain orientation, the ability to direct airflow in multiple directions may be required to allow the server chassis to be mounted in a rack in either orientation (e.g. IO connectors facing the hot aisle or IO connectors facing the cold aisle). One instance in which the reorientation of the rack may be difficult are instances where prefabricated supplemental rack-mountable servers are added to existing server racks to provide local computational services instead of providing remote cloud-based data storage and processing services over networked computing facilities, such as via the internet. Such supplemental on-site servers may offer on-premises systems, local data processing, data residency, and migration of applications with local system interdependencies, and other capabilities. However, in order to accommodate customers with various connector and rack cooling configurations (e.g. IO connectors facing a hot aisle or IO connectors facing a cold aisle) such supplemental on-site servers may be designed with a flexible configuration that allows for mounting at either type of customer facility. In some instances, given the direction of the IO connectors and the direction of the airflow of the existing servers mounted in a rack, a choice may be required whether to maintain a consistent IO connector orientation along with other servers (such as power connectors, network switch connectors, etc.) or maintain a consistent airflow from the cold aisle that provides the cold air that flows through the chassis and out to a hot aisle that accepts heated air exhausted from the chassis.

For example, in the case where servers are to be integrated into an existing rack configuration with the electrical power cable, networking cable, and/or other IO connectors in the rear side of the rack and the hot aisle also on the rear side of the rack, if the fans of the chassis are fixed to direct airflow away from the power cable IO connector and toward the opposite side of the chassis, mounting the server in the rack with an orientation such that the power cable IO connector is at the rear of the rack may result in the fans drawing "cooling air" into the chassis from the hot aisle and exhausting "exhaust air" into the cold aisle, thus frustrating a cooling design of the facility that includes the rack in which the server is being mounted. In such an orientation, the heat removal capacity of the supplemental server would be hindered due to the fans recirculating the heated exhaust air through its chassis, in addition to degrading the cooling efficiency of the facility in which it is mounted, such as a data center. A server system that allows reversible server Input/Output (IO) orientation such that IO connectors can be in the front of the server rack or at the rear of the server rack and which also accommodates multiple airflow directions inside the server system may allow both a consistent IO connector orientation with the existing servers and a consistent airflow direction with existing servers.

As used herein, "air moving device" includes any device, element, system, or combination thereof that can move air. Examples of air moving devices include fans, blowers, and compressed air systems.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, baseboard management controllers (BCM), power supply units, data storage devices, fans, cables, and other components of the computer system.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials. A circuit board can include a printed circuit board.

As used herein, "computing" includes any operations that can be performed by a computer, such as computation, data storage, data retrieval, or communications.

As used herein, "server system" includes any of various server systems, server devices, or components thereof. One example of a server system is a rack-mounted server. As used herein, the term server is not limited to just those integrated circuits referred to in the art as a server or computer which provides resources, data, services, or programs to other computers, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another).

As used herein, a "rack" means a rack, container, frame, or other element or combination of elements that can contain or physically support one or more computer systems. In some embodiments, a rack may be a standard 19" rack that conforms to Electronic Industries Alliance (EIA) standard dimensions. In some embodiments, a standard rack may conform to other standard dimensions such as those defined in Consumer Electronics Association (CEA) standards, International Electrotechnical Commission (IEC) standards, etc. In some embodiments, a 23" rack may be used. Also, in some embodiments, a standard rack, such as a standard 19" rack, may include "1 U", "2 U", "3 U", etc. slots for accepting a server system. In some embodiments a rack may have a height of 42 U.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

Figure 1B:
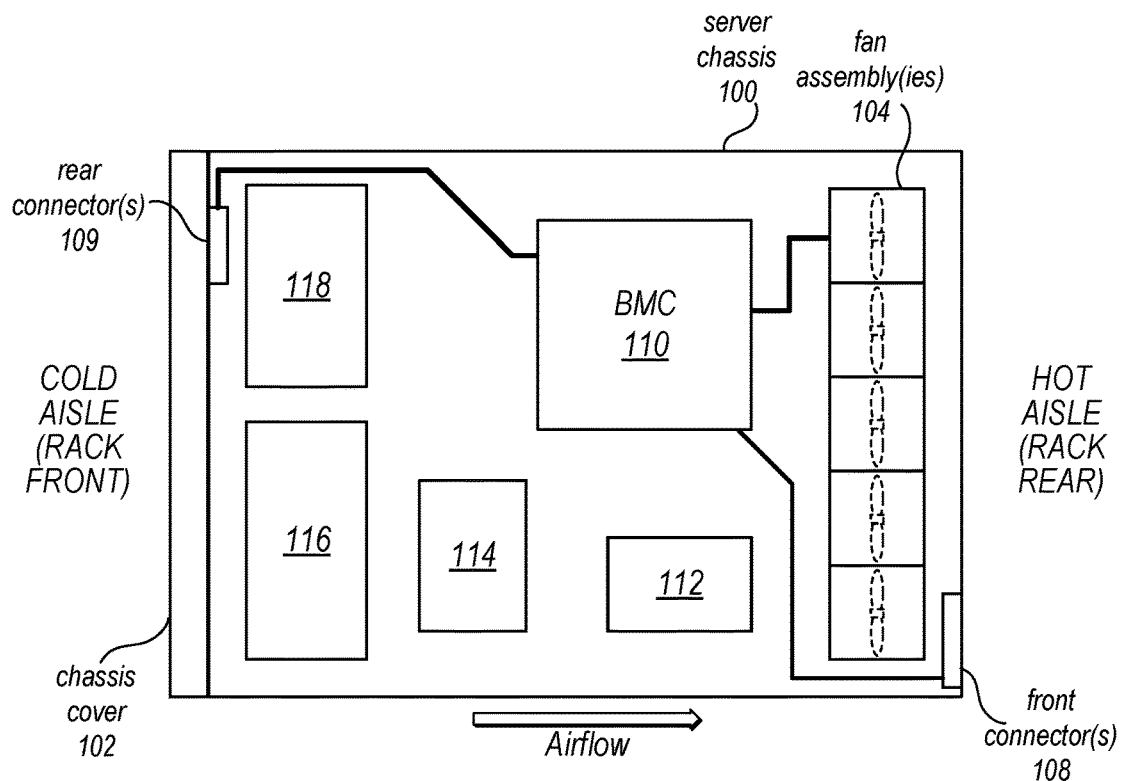

FIGS. 1A-1B illustrate a top down view of a server system that allows reversible server Input/Output (IO) orientation in either of the front or rear of the server rack and accommodates multiple airflow directions inside the server chassis, according to some embodiments. As used herein, "installing" and "mounting" are used interchangeably.

The server system includes a server chassis 100 that may be mounted onto a rack wherein the server chassis 100 includes electronic components that are installed in the chassis interior. Various electronic components of the server system may be disposed inside the server chassis by coupling the components to a portion of the chassis, such that the components are mounted in particular positions in the chassis interior. In some embodiments, the server chassis may be mounted on an industry-standard 42 Rack Unit (42 U) server rack that is 42 U high and 19 inches wide. The server chassis 100 may be mounted in the server rack using mounting fasteners at the front side of the chassis as well as the rear side of the chassis disposed towards the cold aisle.

In some embodiments, the chassis cover 102 may be disposed in the front of the server chassis 100 and connected to one or more front connectors 108 of the server chassis 100, as shown in FIG. 1A. Also, the chassis cover 102 may be disposed in the rear of the server chassis 100 and connected to one or more rear connectors 109 of the server chassis 100, as shown in FIG. 1B. The chassis cover 102 or other sensors may communicate to the baseboard management controller (BMC) 110 connected to both the front connector(s) 108 and the rear connector(s) 109 which side of the chassis 100 that the chassis cover 102 is connected to, whether the front side of the chassis or the rear side of the chassis. Based on the orientation of the chassis cover 102, the BMC may control one or more fan assemblies 104 such that the direction of the airflow with respect to the fan assemblies 104 is directed to flow in a particular direction (e.g. back to front or front to back) based on which side of the chassis the cover 102 is connected to. In some embodiments the BMC may be connected to front connector(s) 108, rear connector(s) 109, and the fan assemblies 104 via intelligent platform management interface (IPMI) formatted communications. The sensors/connectors for detecting the presence of the chassis cover 102 may be open circuit/closed circuit detection. For example, a high resistance (high Ohms) is detected if a connector for the chassis cover 102 is air gapped with no cover attached, and a low resistance (closed circuit) is detected if the cover is attached. Though various other techniques may be used to detect the presence of the chassis cover 102 at a given end of the chassis.

The chassis cover 102 may be configured to connect to the front connector(s) 108 or the rear connector(s) 109 using a pogo connector or other connectors that utilize springs or other mechanisms to apply a constant normal force against the back of the mating receptacle or contact plate to reduce intermittent electrical connections. In some embodiments, a blind mate connector or other types of connectors with a mating action, via a sliding action, snapping action, etc., may be used to enable the connectors to self-align and correct small misalignment when mating the chassis cover 102 to the front connector(s) 108 or the rear connector(s) 109. Additional screws may be used to affix the chassis cover 102 to the server chassis 100 to either the front of the chassis or the rear of the chassis.

In some embodiments, the airflow from the fan assemblies 104 supplies cooling air into the server chassis 100 to remove waste heat from heat-producing components 112, 114, 116, and 118 installed in the server chassis. Cooling air can enter the chassis through chassis cover 102 having an air permeable face with one or more inlet air vents or perforations. The cooling air flows through the various portions of the chassis 100 and removes heat from the heat-producing components 112, 114, 116, and 118. Although an airflow is generated from the fan assemblies 104 in the illustrated embodiment, any air moving device may be used to generate the airflow including various blowers and compressed air systems.

In some embodiments, the BMC may control the one or more fan assemblies 104 (or other air moving devices) to direct the airflow either towards the front connector(s) 108 or the rear connector(s) 109. The BMC may do this by providing a control signal that causes a rotational direction of respective blades of the fans of fan assemblies 104 to be reversed. In some embodiments, fan assemblies 104 may house one or more mechanical actuators coupled to the one or more fan assemblies 104. The BMC may provide a control signal to one or more mechanical actuators to cause the one or more mechanical actuators to rotate the fan assemblies 104 to face the direction as determined by the BMC based on which side the chassis cover 102 is connected to. For example, mechanical rotation of the fan assemblies 103 is further illustrated about a horizontal axis in FIGS. 2A-2C and about a vertical axis in FIGS. 3A-3C. In such embodiments, the blades of the fan assemblies 104 may be optimized for generating higher pressure differential in one direction and rely on the actuators of the fan assemblies 104 to rotate the fan assemblies to accommodate multiple airflow directions. In some embodiments, the fans assemblies 104 may be rotated around the vertical axis or the horizontal axis to adjust the direction of the airflow.

In some embodiments each one of the fan assemblies 104 may be individually rotated about the vertical axis, whereas in other embodiments an entire set of fan assemblies 104 may be rotated as a group in the same direction around the horizontal axis. The size of the fan assemblies 104 and the fan blades therein may be determined prior to their installation in the chassis 100 to enable sufficient vertical clearance for the fan assembly components to rotate around the horizontal axis as further shown in FIGS. 2A-2C. A similar determination in the size of the fan assemblies 104 and the fan blades may be made to enable the fan assembly 104 components to be rotated around the vertical axis as further shown in FIGS. 3A-3C.

Figure 2A:
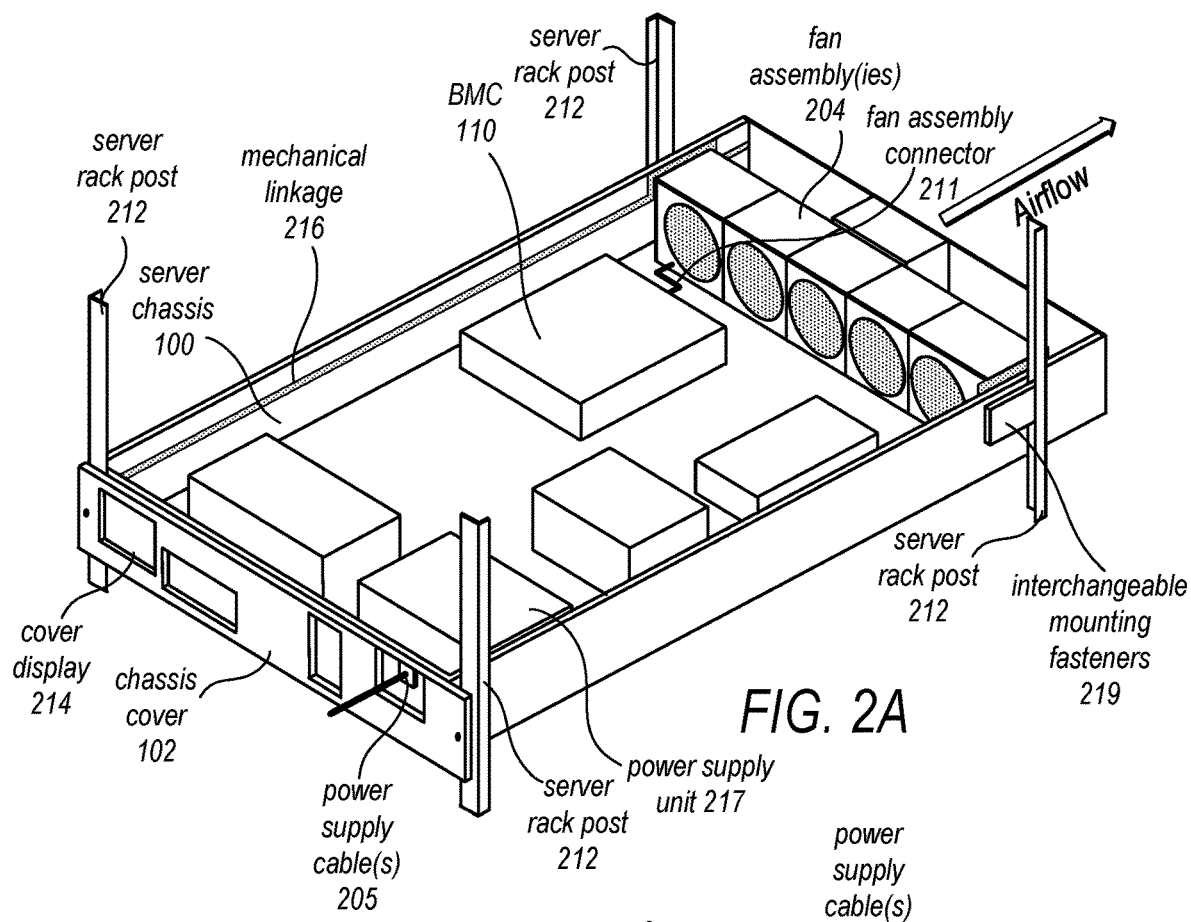
FIGS. 2A-2C illustrate perspective views of an example airflow direction reversal occurring around the horizontal axis in a server system that allows IO orientation in either of the front of the server rack or at the rear of the server rack, according to some embodiments.
Figure 2B:
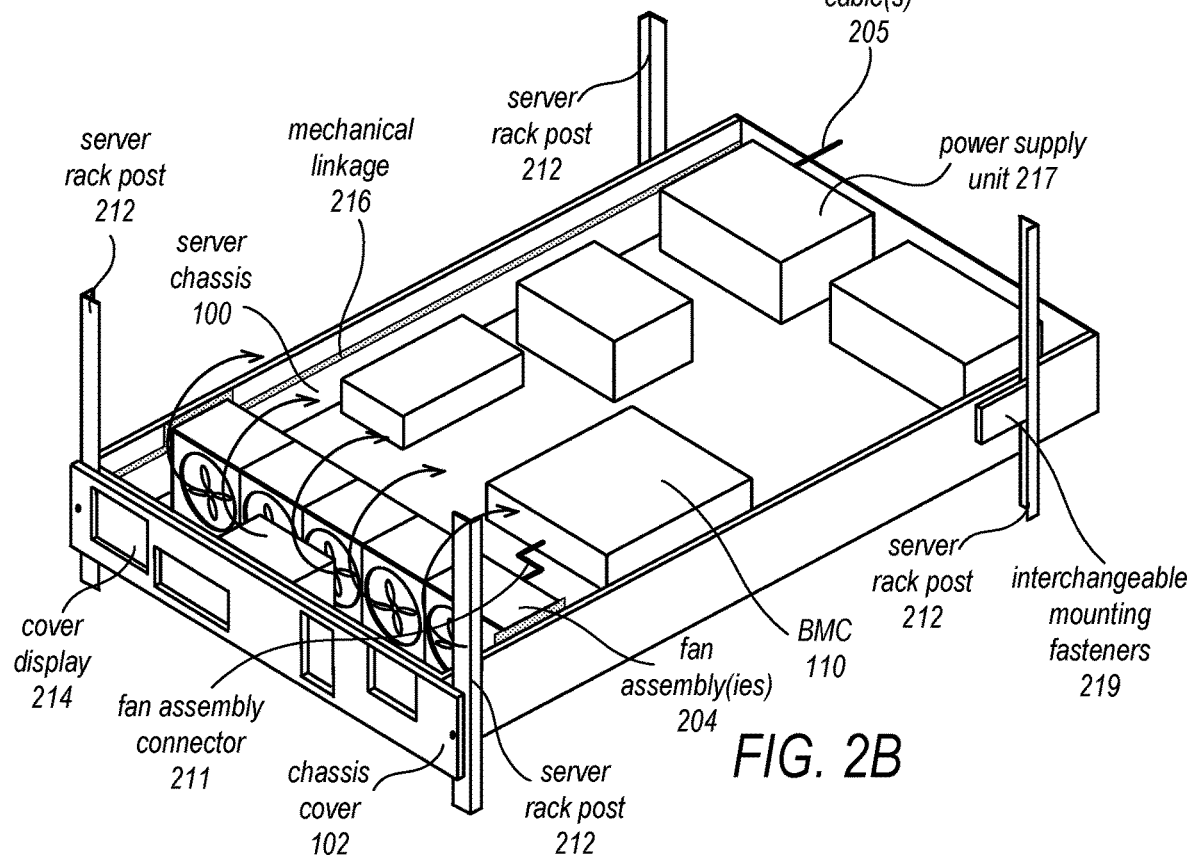
Figure 2C:
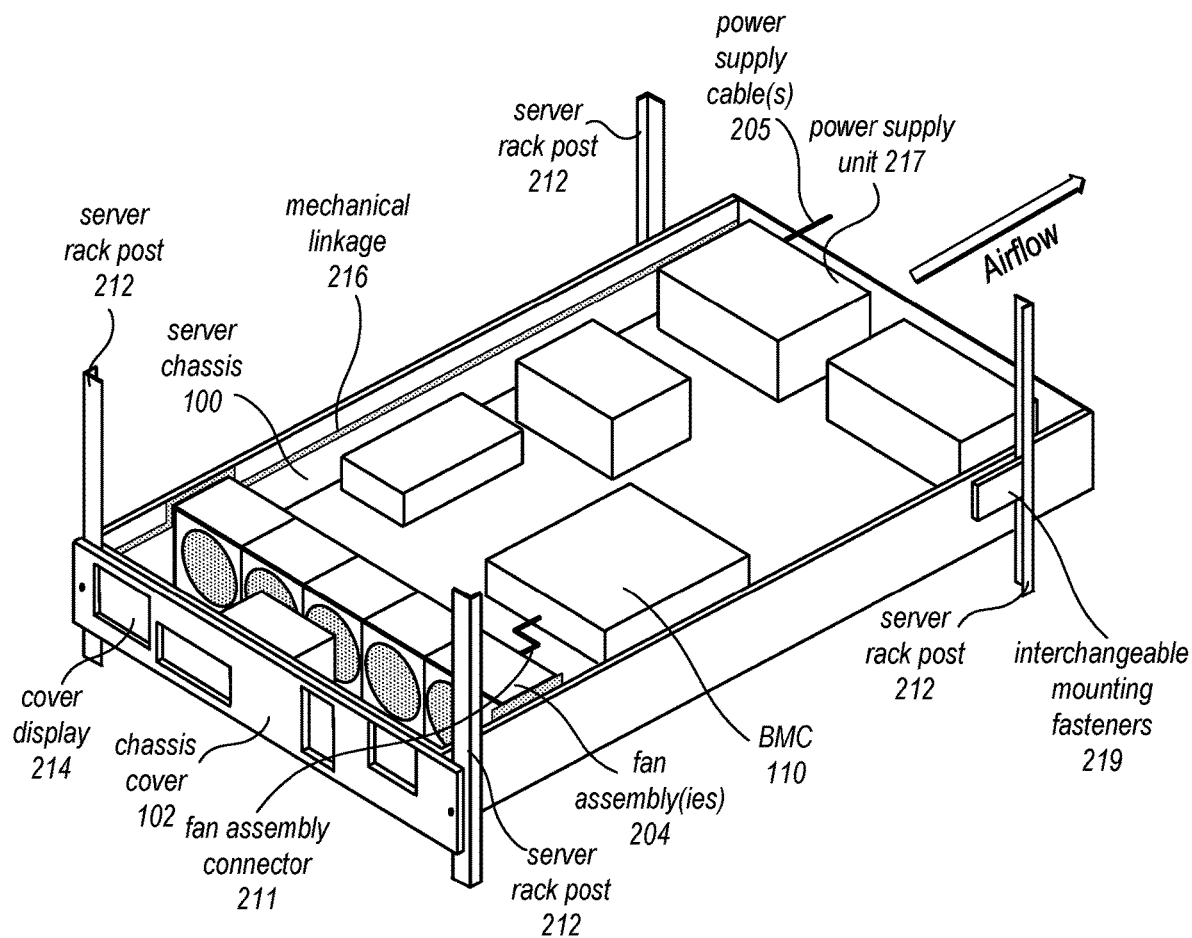

FIGS. 2A-2C are diagrams illustrating a perspective view of a server system and an example airflow direction reversal occurring in the server system, which allows IO orientation of the server system in either of the front of the server rack or at the rear of the server rack, according to some embodiments. The server system of FIGS. 2A-2C respectively includes server chassis 100 that may be mounted onto a server rack wherein the server chassis 100 includes electronic components that are installed in the chassis interior. For example, heat producing components 112, 114, 116, and 118 as shown in FIGS. 1A-1B may be included in server chassis 100 shown in FIGS. 2A-2C. A server rack may comprise multiple server rack posts 212 that may be used to anchor server chassis 100 to the rack. In some embodiments, interchangeable mounting fasteners 219 or "mounting ears" that are configured to couple the server chassis 100 with the server rack posts 212 in multiple orientations may be used. For example, the interchangeable mounting fasteners 219 may connect the server chassis 100 with any one of the server rack posts 212 whether in the orientation shown in FIG. 2A or in FIG. 2C. In some embodiments, the server chassis 100 may be coupled to the server rack posts 212 using slide rails upon which the server chassis 100 may travel and be seated into a designated position in the server rack. The interchangeable mounting fasteners 219 may be part of the chassis cover 102 and secure the chassis cover 102 along with the server chassis 100 that has been seated into the designated position through the slide rails to one or more server rack posts 212. The sensors that detect the presence of the chassis cover 102 may communicate to the BMC 110 which side of the server chassis 100 that the chassis cover 102 is connected to, whether the front side of the chassis or the rear side of the chassis. Based on the orientation of the chassis cover 102, the BMC may control one or more fan assemblies 204 to adjust a direction of the airflow.

FIG. 2A depicts the an initial orientation of the server chassis 100 attached to the server rack posts 212 with the power supply unit 217 positioned on the front side of the server rack. In this first orientation the chassis cover 102 may be disposed on the side of the server chassis 100 facing the front side of the server rack and connected to one or more front connectors of the server chassis 100. In some embodiments, the chassis cover 102 may further include one or more cover displays 214 that are able to provide status information of the server at the front or rear of the server chassis 100 based on which face of the server chassis 100 the chassis cover 102 is connected to. In some embodiments, network cover display 214 is able to display further server system information such as server connection status, temperature, processor usage, or memory, etc. The chassis cover 102 may allow access to the IO connectors such as power supply cables 205 that connect to the power supply unit 216. Various other IO connectors may be accessed including networking connection ports such as registered jack 45 (RJ45) ports and form-factor pluggable (SFP) ports.

FIG. 2B depicts an orientation of the server chassis 100 wherein the rear of the server chassis 100 as shown in FIG. 2A has been shifted to the front of the server rack and the chassis cover 102 is attached to the side of the server chassis 100 that was the rear side as shown in FIG. 2A. The chassis cover 102 is configured to allow reversible server IO orientation that allows either face of the server chassis 100 to be in the front of the server rack or at the rear of the server rack while at the same time allowing access to the various IO connectors that may exist in only one of the sides of the server chassis 100, such as the side of the server chassis 100 now facing the front of the server rack. Once the rear of the server chassis 100 has been shifted to the front of the server rack and the chassis cover 102 is attached to the rear side of the server chassis 100, the server system may undergo rotation of the fan assemblies 204 as shown in FIG. 2B. Note that the terms "front side" and "rear side" of the server chassis 100 are used herein for ease of explanation. However, depending on the orientation of a hot aisle and a cold aisle at a given facility and the orientation of the server system to conform to the hot aisle/cold aisle configuration, either end may be referred to, for example by a user of the server system, as a "front" or "rear" of the server chassis. Though regardless of how the ends are labeled by a user, the embodiments described herein allow for the server system to be mounted in either type of configuration, e.g. cold aisle on a side with the IO connectors or hot aisle on a side with the IO connectors.

In some embodiments, the connection of the chassis cover 102 to the server chassis 100 may trigger the BMC to control one of more fan assemblies 104 to direct the airflow either towards the front or the rear of the chassis. The BMC may provide a control signal through the fan assembly connector 211 to direct one or more mechanical actuators coupled to the one or more fan assemblies 204 to rotate fans around the horizontal axis to face the direction as determined by the chassis 100 orientation via the BMC. In some embodiments each one of the fan assemblies 204 may be rotated, whereas in other embodiments an entire band of fan assemblies 204 may be rotated in the same direction around the horizontal axis. The size of the fan assemblies 104 and the fan blades therein may be determined prior to their installation in the chassis 100 to enable sufficient vertical clearance for the fan assembly components to rotate around the horizontal axis. The blades of the fan assemblies 204 may be optimized for generating higher pressure differential in one direction and may rely on the actuators of the fan assemblies 204 to rotate the fan assemblies to accommodate multiple airflow directions. The speed of the fans and the amount of airflow generated may furthermore be based on the temperature as measure by one or more temperature sensors inside the chassis 100 or any of the components therein. In some embodiments, instead of the BMC sending a control signal to the actuator, the chassis cover 102, the chassis 100 or the chassis connectors coupling the chassis cover 102 to the chassis may trigger the rotation of the fan assemblies 204 via the actuators inside the fan assemblies 204. In some embodiments, the rotation of the fan assemblies 204 may be caused mechanically through a mechanical linkage 216 that provides the rotational force to the actuators inside the fan assemblies 204.

FIG. 2C depicts the orientation of the server chassis 100 wherein the rear of the server chassis 100 has completed being shifted to the front of the server rack, the chassis cover 102 is attached to the rear side of the server chassis 100, and the fan assemblies 204 has completed changing the direction of the airflow. In this orientation, the IO connectors such as power cable connectors that allow access to the power supply unit 217 may be assessable from the rear of the server rack. The chassis cover 102 is configured to allow reversible server IO orientation and would allow various IO connectors now in the front of the server rack to be accessible through the chassis cover in some embodiments.

Note that FIGS. 2A-2C illustrate embodiments wherein the fan assemblies are physically rotated about a horizontal axis. However, in some embodiments, for example as shown in FIGS. 1A-1B, the rotational directions of the fan blades of the fan assemblies 104 may be reversed without physically rotating the fan assemblies 104 in order to reverse an airflow direction through the server chassis 100.

Figure 3A:
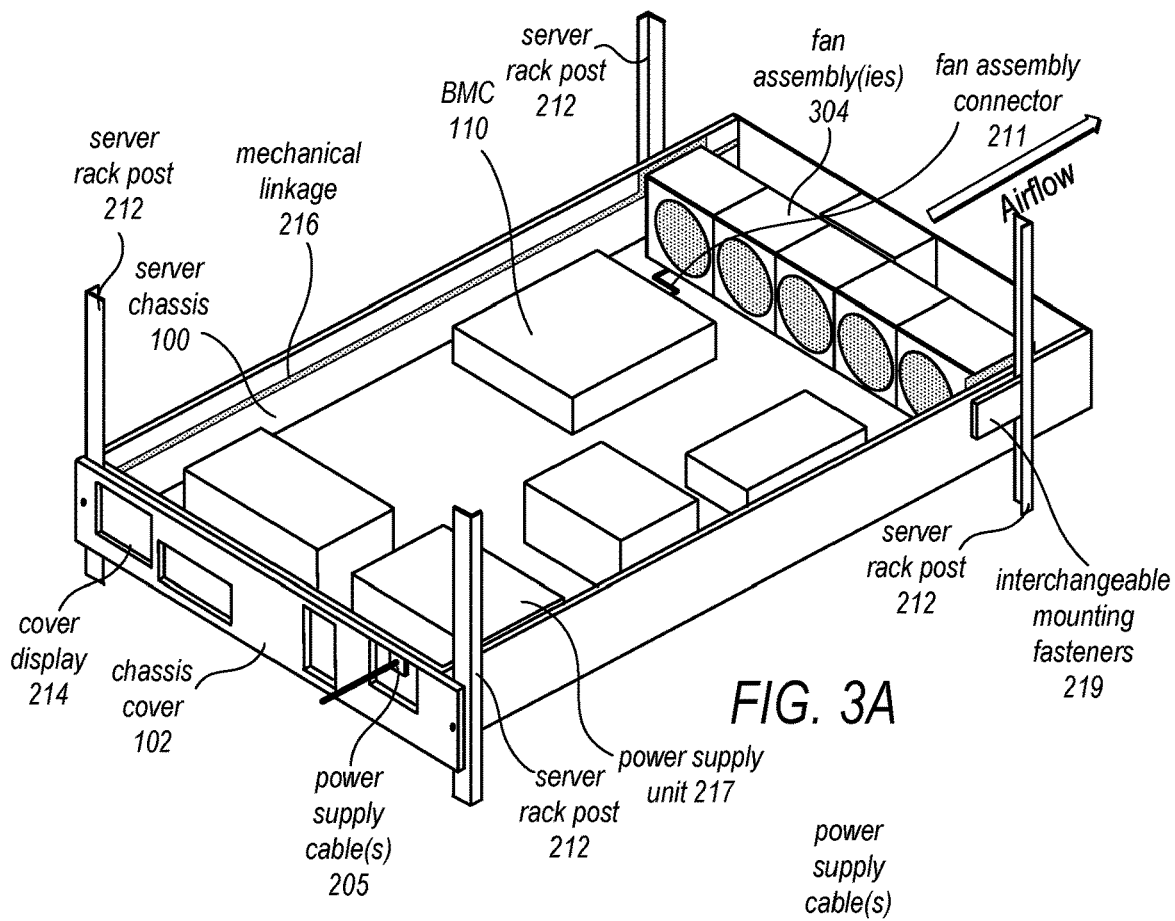
FIGS. 3A-3C illustrate perspective views of an example airflow direction reversal occurring around the vertical axis in a server system that allows IO orientation in either of the front of the server rack or at the rear of the server rack, according to some embodiments.
Figure 3B:
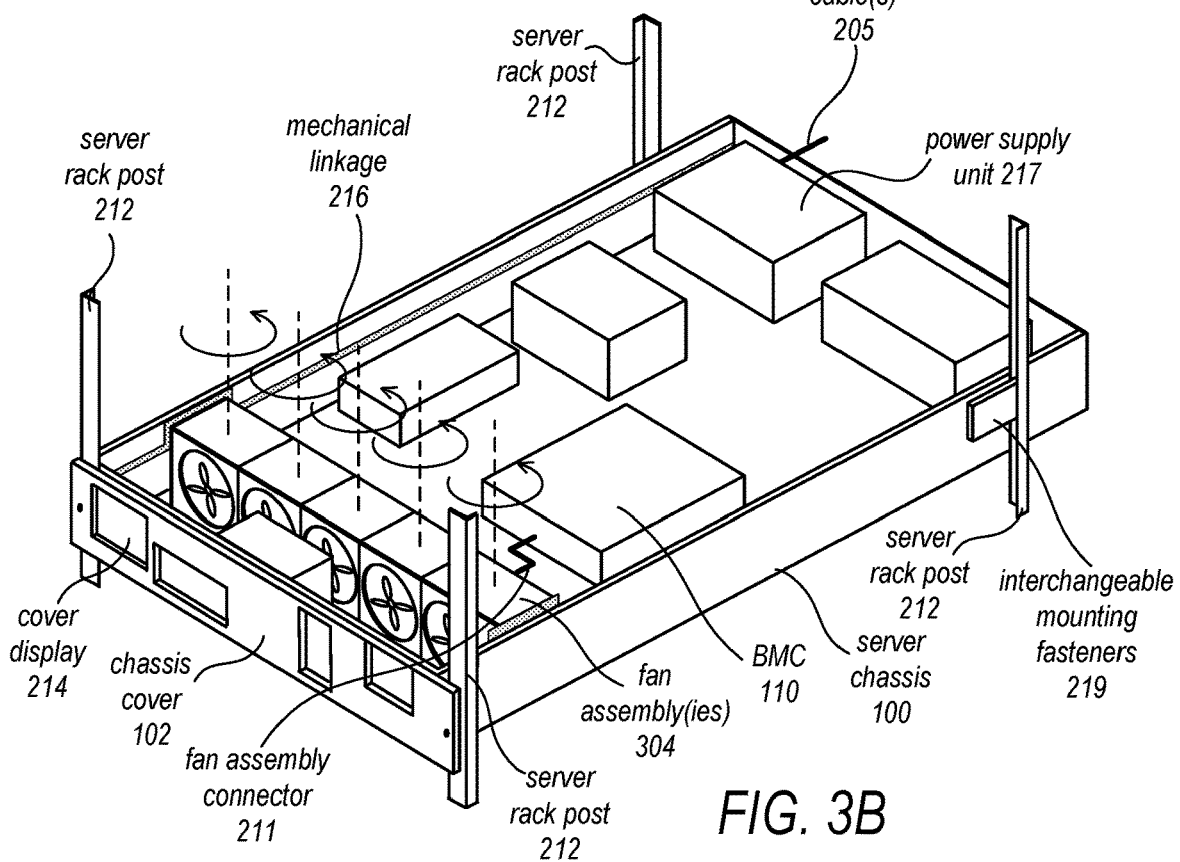
Figure 3C:
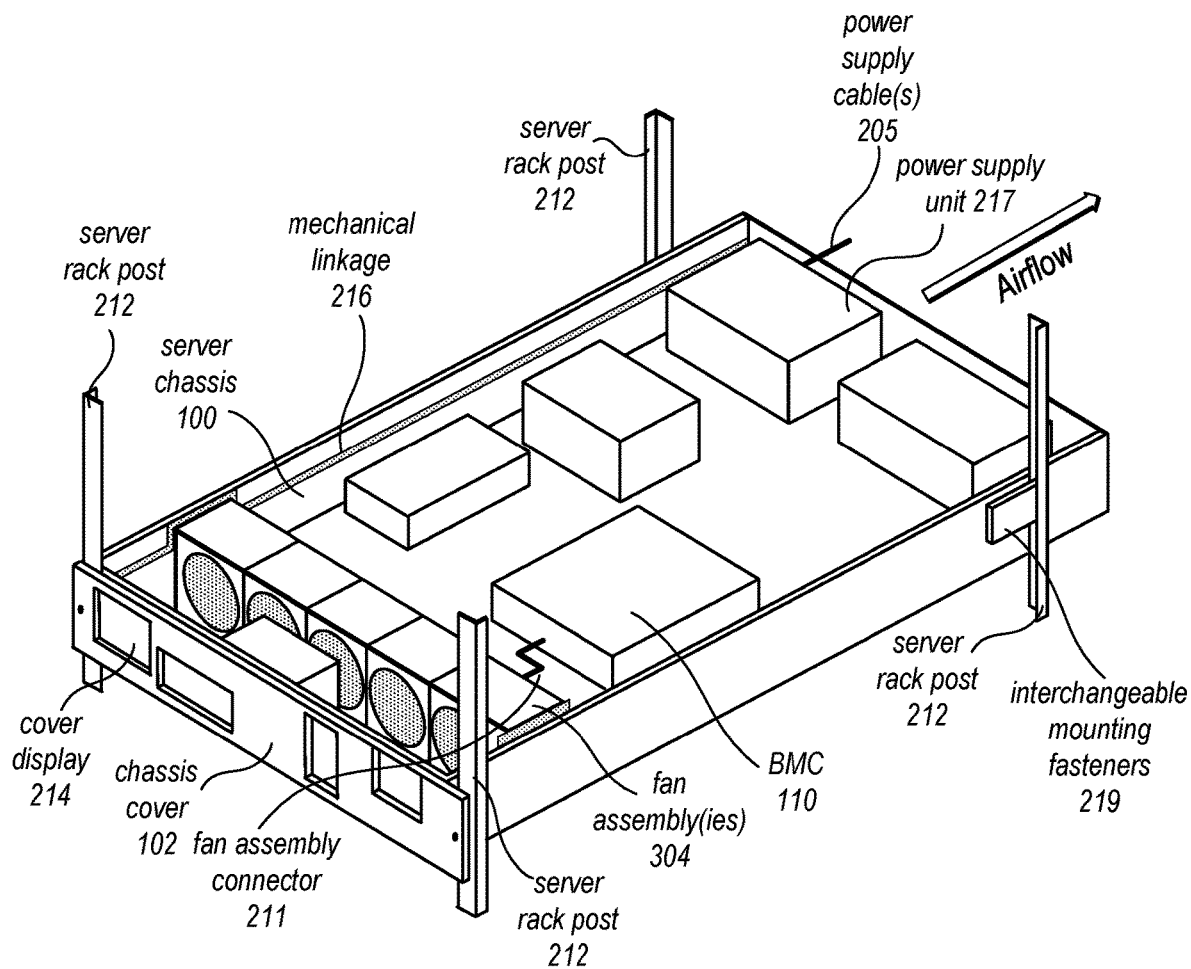

FIGS. 3A-3C is a diagram illustrating a perspective view of a server system and an airflow direction reversal occurring around the vertical axis in the server system that allows IO orientation for the server system in either of the front of the server rack or at the rear of the server rack, according to some embodiments. The server system of FIGS. 3A-3C respectively includes server chassis 100 that may be mounted in a server rack wherein the server chassis 100 includes electronic components, such as heat producing components 112, 114, 116, etc. that are installed in the chassis interior. A server rack may comprise multiple server rack posts 212 that may be used to anchor server chassis 100 to the rack. In some embodiments, interchangeable mounting fasteners 219 or "mounting ears" that are configured to couple the server chassis 100 with the server rack posts 212 in multiple orientations may be used. For example, the interchangeable mounting fasteners 219 may connect the server chassis 100 with any one of the server rack posts 212 whether in the orientation shown in FIG. 3A or in FIG. 3C. In some embodiments, the server chassis 100 may be coupled to the server rack posts 212 using slide rails upon which the server chassis 100 may travel and be seated into a designated position in the server rack. The interchangeable mounting fasteners 219 may be part of the chassis cover 102 and secure the chassis cover 102 along with the server chassis 100 that has been seated into the designated position through the slide rails to one or more server rack posts 212. The sensors that detect the coupling of chassis cover 102 may communicate to the BMC 110 which side of the server chassis 100 that the chassis cover 102 is connected to, whether the front side of the chassis or the rear side of the chassis. Based on the orientation of the chassis cover 102, the BMC may control one or more fan assemblies 304 to adjust the direction of the airflow.

FIG. 3A depicts the an initial orientation of the server chassis 100 attached to the server rack posts 212 with the power supply unit 217 positioned on the front side of the server rack. In this first orientation the chassis cover 102 is disposed in the front of the server chassis 100 and connected to one or more front connectors of the server chassis 100. In some embodiments, the chassis cover 102 may further include one or more cover displays 214 that are able to provide status information of the server at the front or rear of the server chassis 100 based on which face of the server chassis 100 the cover is connected to. The chassis cover 102 may allow access to the IO connectors such as power supply cables 205 that connect to the power supply unit 216. Various other IO connectors may be accessed including networking connection ports such as registered jack 45 (RJ45) ports and form-factor pluggable (SFP) ports.

FIG. 3B depicts the orientation of the server chassis 100 wherein the rear of the server chassis 100 has been shifted to the front of the server rack and the chassis cover 102 is attached to the rear side of the server chassis 100. The chassis cover 102 is configured to allow reversible server IO orientation that allows either faces of the server chassis 100 to be in the front of the server rack or at the rear of the rack while at the same time allowing access to the various IO connectors that may exist in the side of the server chassis 100 now facing the front of the server rack. Once the rear of the server chassis 100 has been shifted to the front of the server rack and the chassis cover 102 is attached to the rear side of the server chassis 100, the server system may undergo rotation of the fan assemblies 304 as shown in FIG. 3B.

In some embodiments, the connection of the chassis cover 102 to the chassis may trigger the BMC to control one of more fan assemblies 104 to direct the airflow either towards the front or the rear of the chassis. The BMC may provide a control signal through the fan assembly connector 211 to direct one or more mechanical actuators coupled to the one or more fan assemblies 304 to rotate fans around the vertical axis to face the direction as determined by the BMC. The size of the fan assemblies 304 and the fan blades may be selected to enable the fan assembly 304 components to be rotated about the vertical axis. Although the present illustration in FIG. 3B depicts individual ones of the fan assembly rotating in multiple vertical axis, in some embodiments sets of fan assemblies may be rotated around a common vertical axis with sufficient clearance inside the server chassis 100 to allow such rotation. The blades of the fan assemblies 304 may be optimized for generating higher pressure differential in one direction and rely on the actuators of the fan assemblies 304 to rotate the fan assemblies to accommodate multiple airflow directions. The speed of the fans and the amount of airflow generated may furthermore be based on a temperature as measured by one or more temperature sensors included in chassis 100 or any of the components therein. In some embodiments, instead of the BMC sending a control signal to the actuator, the chassis cover 102, the chassis 100 or the chassis connectors coupling the chassis cover 102 to the chassis may trigger the rotation of the fan assemblies 304 via the actuators inside the fan assemblies 304. In other embodiments, the rotation of the fan assemblies 304 may be caused mechanically through a mechanical linkage 216 that provides the rotational force to the actuators inside the fan assemblies 304.

FIG. 3C depicts an orientation of the server chassis 100 wherein the rear of the server chassis 100 has completed being shifted to the front of the server rack, the chassis cover 102 is attached to the rear side of the server chassis 100, and the fan assemblies 304 have completed being rotated to change the direction of the airflow. In this orientation, the IO connectors such as power cable connectors that allow access to the power supply unit 217 may be assessable from the rear of the server rack. The chassis cover 102 is configured to allow reversible server IO orientation and would allow various IO connectors now in the front of the server rack to be accessible through the chassis cover in some embodiments.

Figure 4A:
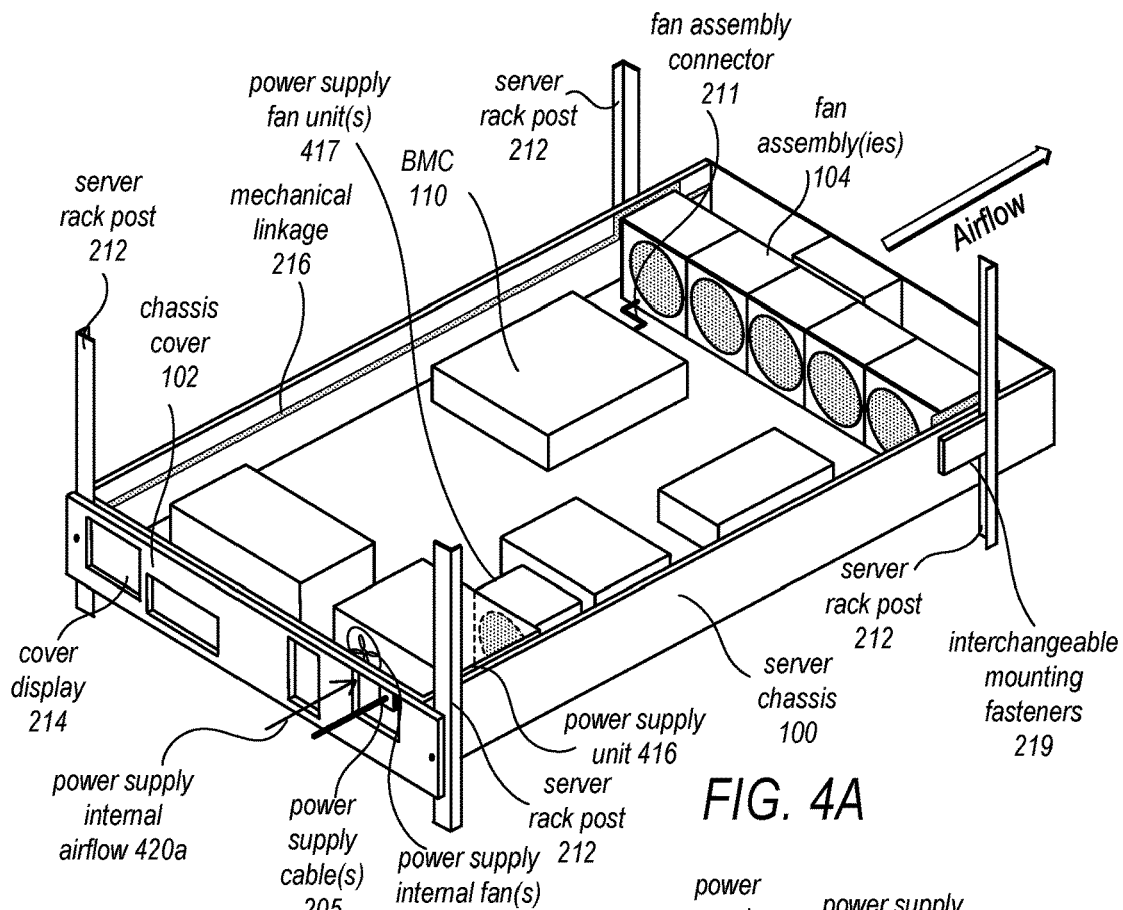
FIGS. 4A-4B illustrate example power supply unit and power supply unit fan that allow airflow direction reversal, according to some embodiments.
Figure 4B:
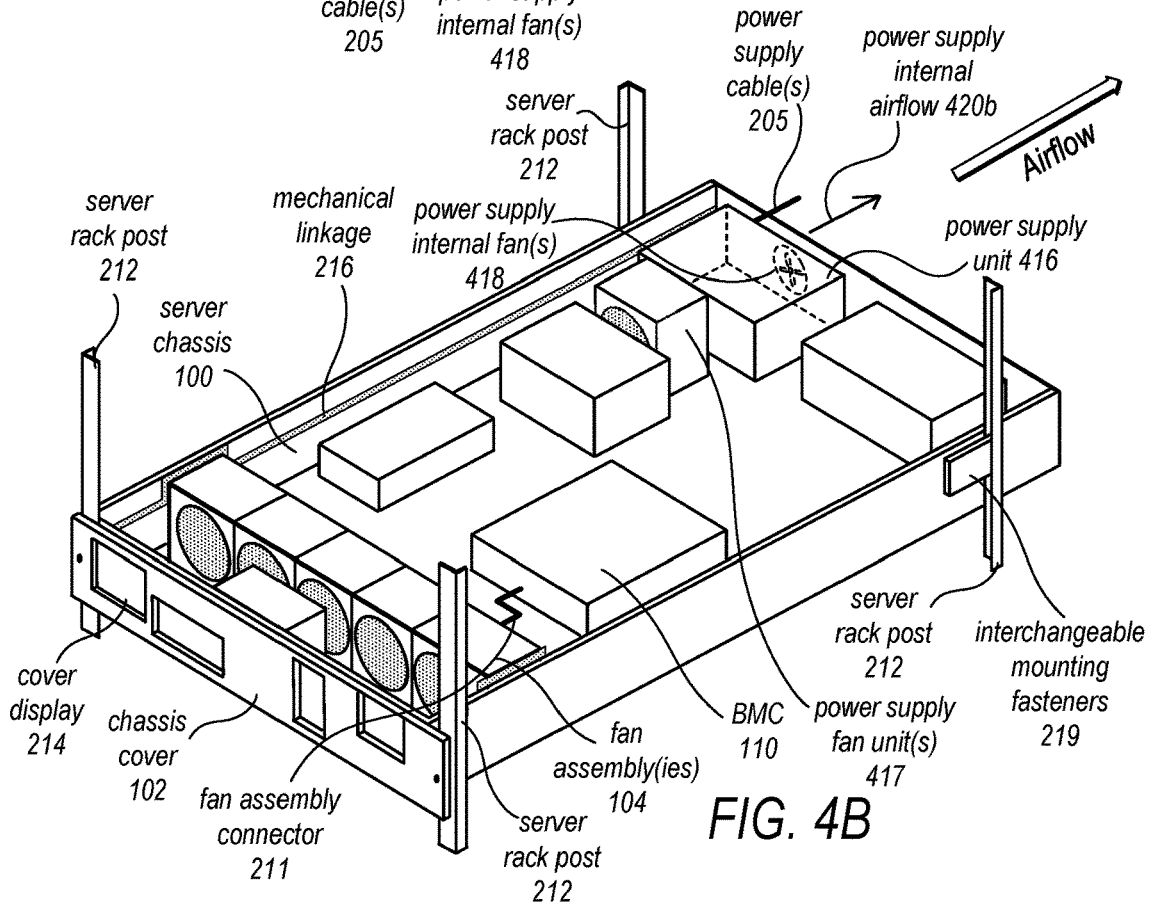

FIG. 4A-4B illustrate details for an example power supply unit and power supply unit fan included in the server chassis that allows airflow direction reversal, according to some embodiments. The server system of FIGS. 4A-4B respectively includes server chassis 100 that may be mounted onto a server rack wherein the server chassis 100 includes electronic components that are installed in the chassis interior, including a power supply unit 416 having one or more internal fans 418 and/or a power supply fan unit 417 supplying airflow to the power supply unit 416. Although for the ease of illustration, both the power supply fan unit 417 and the internal fan 418 are shown together, it is not necessarily required to have both an internal and an external fan. In some embodiments, the server chassis 100 may only contain a power supply fan unit 417 that generates an internal airflow, or may only contain a power supply internal fan 418. Similar to FIGS. 2A-C and 3A-C, the server rack may comprise multiple server rack posts 212 that may be used to anchor server chassis 100 to the rack. In some embodiments, interchangeable mounting fasteners 219 or "mounting ears" that are configured to couple the server chassis 100 with the server rack posts 212 in multiple orientations may be used. For example, the interchangeable mounting fasteners 219 may connect the server chassis 100 with any one of the server rack posts 212 whether in the orientation shown in FIG. 4A or in FIG. 4B. In some embodiments, the server chassis 100 may be coupled to the server rack posts 212 using slide rails upon which the server chassis 100 may travel and be seated into a designated position in the server rack. The interchangeable mounting fasteners 219 may be part of the chassis cover 102 and secure the chassis cover 102 along with the server chassis 100 that has been seated into the designated position through the slide rails to one or more server rack posts 212. The sensors that detect the coupling of chassis cover 102 may communicate to the BMC 110 which side of the server chassis 100 that the chassis cover 102 is connected to, whether the front side of the chassis or the rear side of the chassis. Based on the orientation of the chassis cover 102, the BMC may control one or more fan assemblies 204 to adjust the direction of the airflow.

Similar to that of FIGS. 2A and 3A, FIG. 4A depicts one orientation of the server chassis 100, wherein the server chassis 100 is attached to the server rack posts 212 with the power supply unit 416 positioned on the front side of the server rack. In this first orientation the chassis cover 102 is disposed in the front of the server chassis 100 and connected to one or more front connectors of the server chassis 100. The chassis cover 102 may allow access to the IO connectors such as power supply cables 205 that connect to the power supply unit 416. Various other IO connectors may be accessed including networking connection ports such as registered jack 45 (RJ45) ports and form-factor pluggable (SFP) ports. Fan assemblies 104 supply cooling air into the server system to remove waste heat from heat-producing components installed in the server chassis. Additionally, fans supplying airflow to the power supply such as the internal fan 418 and/or the power supply fan unit 417 further supplies cooling air into the power supply unit 416 to remove waste heat produced by the power supply unit 416. In FIG. 4A the rotational direction of the power supply internal fan 418 is such to create power supply internal airflow 420a that matches the fan assembly airflow. In some embodiments, one or more power supply fans 417 may provide power supply internal airflow 420a that matches the fan assembly airflow. Similar to the fan assemblies of FIGS. 2A-2C or FIGS. 3A-3C, the power supply fan unit 417 may be configured to be rotated about the vertical axis or the horizontal axis to match the fan assembly airflow. Cooling air can enter the chassis through the chassis cover 102 which has an air permeable face with one or more inlet air vents or perforations. The cooling air can flow through the various portions of the chassis 100 and remove heat from the heat-producing components. The cooling air can then flow through the power supply unit 416 in accordance with internal airflow 420a.

Based on the orientation of the cover display 102 and the server chassis 100, the server system may undergo rotation of the fan assemblies 204 to allow the air from the cold aisle to enter the chassis 100 and exit to the hot aisle. Similar to that of FIGS. 2C and 3C, FIG. 4B depicts a reversed orientation of the server chassis 100 attached to the server rack posts 212 with the power supply unit 416 positioned on the back side of the server rack. In some embodiments, once the connection of the chassis cover 102 to the chassis is made after a change in server chassis 100 orientation, the connection may trigger the BMC to control one of more fan assemblies 104, the power supply fan unit 417 and/or the power supply internal fan 418 to direct the airflow to maintain the airflow from the cold aisle to the hot aisle. The BMC may provide a control signal through the fan assembly connector 211 to direct one or more mechanical actuators coupled to the one or more fan assemblies 104 to rotate fans around the horizontal or vertical axis to face the direction as determined by the chassis 100 orientation via the BMC. In some embodiments, the BMC may provide a control signal to the power supply 416 to signal to the internal fan 418 to spin its fan blades in a certain rotation as to generate an airflow matching the directional airflow generated by the fan assemblies 104. In some embodiments, the BMC may provide a control signal to the power supply fan unit 417 to be rotated about the vertical axis or the horizontal axis to face the direction as determined by the BMC and match the fan assembly airflow, similar to the fan assemblies described in FIGS. 2A-2C or FIGS. 3A-3C. In FIG. 4B, the rotational direction of the power supply internal fan 418 may be reversed to create a power supply internal airflow 420b that matches the reversed fan assembly airflow. In some embodiments, the power supply fan unit 417 may be rotated to generate the power supply internal air flow 420b. In some embodiments each one of the fan assemblies 104 may be rotated, whereas in other embodiments an entire band of fan assemblies 104 may be rotated in the same direction around the horizontal or vertical axis. In some embodiments, instead of the BMC sending a control signal to the actuator of the fan assemblies 104 and the power supply fan unit 417/internal fan 418, the chassis cover 102, the chassis 100 or the chassis connectors coupling the chassis cover 102 to the chassis may trigger the rotation of the fan assemblies 104 via the actuators inside the fan assemblies 104. In some embodiments, the rotation of the fan assemblies 104 may be caused mechanically through a mechanical linkage 216. In some embodiments, fan blade rotation direction of fans, such as fans included in fan assembly 104 may be reversed without physically rotating the fan assemblies. In such embodiments, a fan blade direction of a power supply unit fan may also be controlled to cause the power supply to direct air in a same direction as the fans of the fan assemblies.

Figure 5:
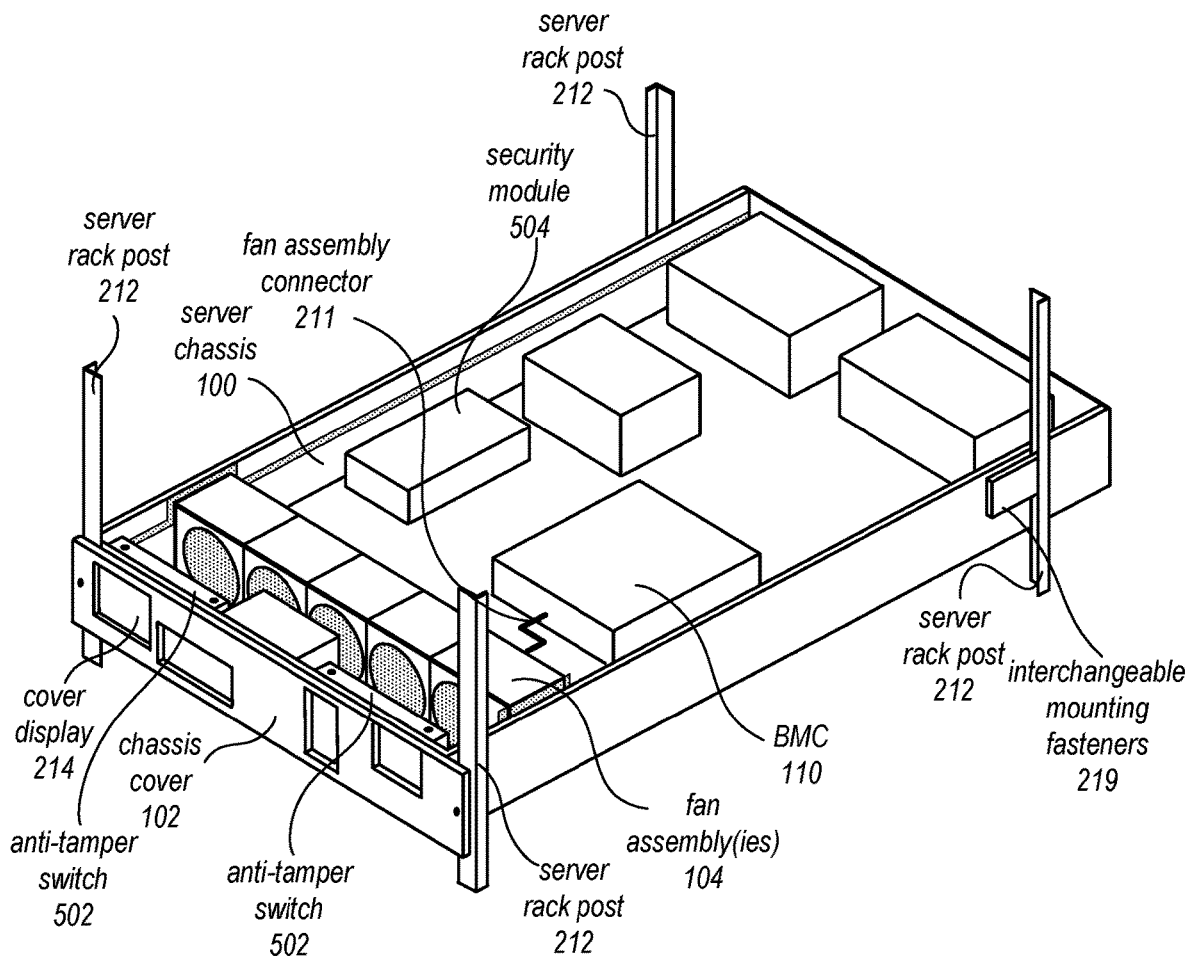
FIG. 5 illustrates an example server chassis of the server comprising one or more anti-tamper switches to detect an attempt to open the server chassis, according to some embodiments.

FIG. 5 illustrates an example server chassis of the server system, wherein the chassis comprises one or more anti-tamper switches configured to detect an attempt to open the server chassis, according to some embodiments. As shown in the illustration, an initial orientation of the server chassis 100 may be similar to that of FIG. 2C. In other embodiments, the server chassis 100 may be oriented in the reverse orientation similar to that of FIG. 2A. The sensors that detect the coupling of chassis cover 102 may communicate to the BMC 110 which side of the server chassis 100 that the chassis cover 102 is connected to, whether the front side of the chassis or the rear side of the chassis. In some embodiments, interchangeable mounting fasteners 219 or "mounting ears" that are configured to couple the server chassis 100 with the server rack posts 212 in multiple orientations may be used. In some embodiments, the server chassis 100 may be coupled to the server rack posts 212 using slide rails upon which the server chassis 100 may travel and be seated into a designated position in the server rack. The interchangeable mounting fasteners 219 may be part of the chassis cover 102 and secure the chassis cover 102 along with the server chassis 100 that has been seated into the designated position through the slide rails to one or more server rack posts 212. Based on the orientation of the chassis cover 102, the BMC may control one or more fan assemblies 104 to adjust a direction of the airflow. In some embodiments, the chassis cover 102 may further include one or more cover displays 214 that are able to provide status information for the server at the front or rear of the server chassis 100 based on which face of the server chassis 100 the cover is connected to.

In some embodiments, anti-tamper switches 502 may be coupled to the server chassis 100 to give indication of tampering or attempted tampering of the server system. In some embodiments, the anti-tamper switches 502 may be magnetic switches that are placed underneath screws securing any one or more of the walls of the server chassis 100 to the server chassis 100. The anti-tamper switches 502 may be configured to detect removal or attempted removal of the screws or various other locks and fasteners. In other embodiments, anti-tamper switches 502 may be proximity sensors utilizing other methods of detection such as changes in electrical potential, to detect the removal or attempted removal of the screws and/or walls of the server chassis 100, wherein the screws and walls are being monitored by the anti-tamper switches 502. In some embodiments, the anti-tamper switches 502 may be placed underneath the server chassis 100 base and be coupled to a tray system wherein the anti-tamper switches 502 detect whether the chassis has been separated or attempted to be separated from the tray system. The anti-tamper switches 502 in some embodiments may detect removal of bolts or other fasteners coupling the server chassis 100 and/or the chassis cover 102 to the server rack post 212—the anti-tamper switches 502 may detect the removal or attempted removal of the bolts or other types of fasteners in a manner similar to that of the various types of anti-tamper switches described above. The anti-tamper switches 502 are configured to send indication of removal or attempted removal of the screws or walls to the BMC 110 to prevent the server system from booting. In some embodiments, the anti-tamper switches 502 may utilize a pin and stake key mechanism that is magnetically set to lock the server chassis 100 from the inside, wherein the engagement of pin and stake key mechanism is required for the server system to boot. Anti-tamper switches 502 may furthermore send such indication of tampering to the BMC 110 to deny logical access to the server system. In some embodiments, in addition to or as an alternative to sending the indication of tampering to the BMC 110, the anti-tamper switches may send an indication of tampering to a security module 504 of the server system. The security module 504 is configured to send cryptographic signature to the BMC 110 or to other components of the server system to prevent the server system from booting. In some embodiments, the security module 504 may detect whether a chassis cover 102 comprising a data storage containing cryptographic signature data is connected to the server chassis 100. The security module 504 may be configured to verify and send indication of a missing or incorrect cryptographic signature to the BMC 110 or to other components of the server system to prevent the server system from booting. The security module 504 may furthermore send such indication to the BMC 110 to deny logical access to the server system.

Figure 6:
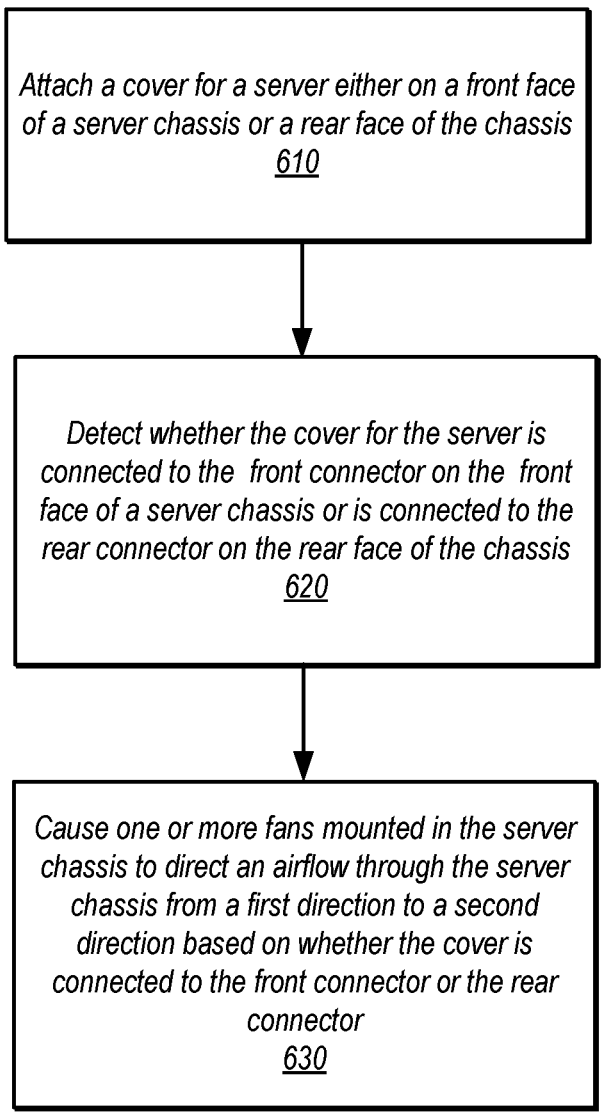
FIG. 6 is a flow diagram illustrating operations performed by the server system to allow reversible server Input/Output (IO) orientation in either of the front of the server rack or at the rear of the server rack and to accommodate multiple airflow directions inside the server chassis, according to some embodiments.

The server systems discussed in FIGS. 1-5 provide examples of a system that allows reversible server IO orientation in either of the front of the server rack or at the rear of the server rack and accommodates multiple airflow directions inside the server chassis. FIG. 6 is a flow diagram illustrating operations performed by example embodiments of the server system to allow reversible server Input/Output (IO) orientation in either of the front of the server rack or at the rear of the server rack and to accommodate multiple airflow directions inside the server chassis, according to some embodiments. Various systems and devices may implement the various methods and techniques described below, either singly or working together. For example, a fan assembly may be controlled by additional processors instead of a BMC. Alternatively, a combination of different systems and/or devices may implement the various methods. Therefore, the above examples and or any other systems or devices referenced herein as performing the illustrated method, are not intended to be limiting as to other different components, modules, systems, or configurations of systems and devices similarly configured to perform such operations.

As indicated at 610, a cover for a server is attached either on a front face of a server chassis or a rear face of the chassis. The server chassis cover may further include one or more displays wherein the displays are able to provide status information of the server at the front or rear of the server based on which face the cover is connected. In some embodiments, an anti-tamper switch may act in conjunction with a security module that provides a cryptographic signature to allow the server system to boot normally and grant logical access to the server system.

As indicated at 620, the cover for the server is detected as either connected to the front connector on the front face of a server chassis or is connected to the rear connector on the rear face of the chassis. In some embodiments the BMC may be connected to both front and rear connectors and may determine which side of the chassis cover is coupled to. In some embodiments, the orientation of the chassis and the chassis cover may be detected by a controller included in the fan assemblies.

As indicated at 630, the one or more fans mounted in the server chassis are controlled and/or adjusted to direct an airflow through the server chassis from a first direction to a second direction based on the orientation of the server chassis relative to the chassis cover. In some embodiments, the connection of the chassis cover to the chassis may trigger the BMC to control one of more fan assemblies and rotate them via actuators included in the fan assemblies. In some embodiments, the rotation of the fan assemblies may be caused mechanically through a fan assembly connector providing a rotational force to the actuators inside the fan assemblies.

Figure 7:
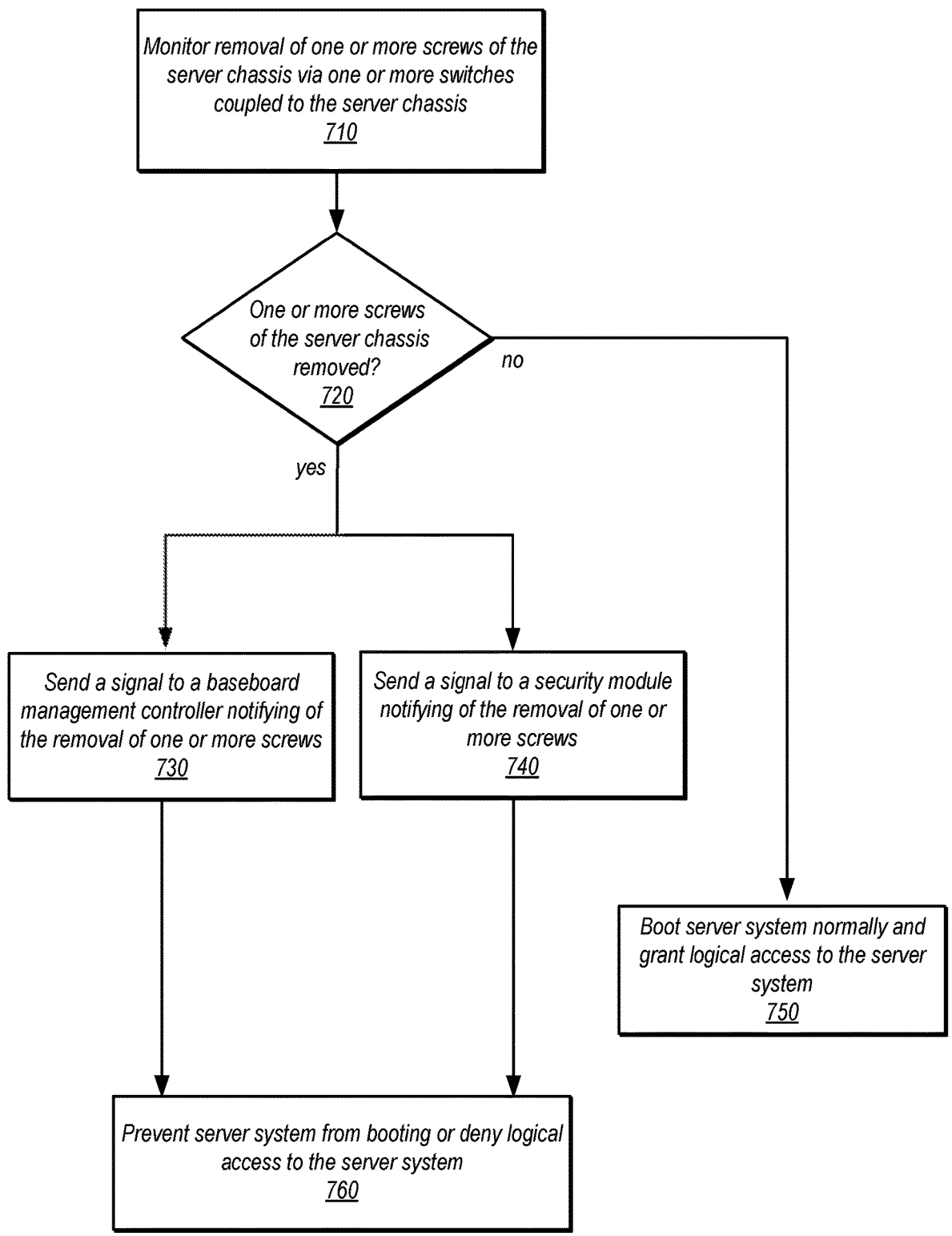
FIG. 7 is a flow diagram illustrating operations performed by the server system comprising one or more anti-tamper switches to secure the server system from an attempt to open the server chassis, according to some embodiments.

FIG. 7. is a flow diagram illustrating operations performed by the server system comprising one or more anti-tamper switches to secure the server system in response to detection of an attempt to open the server chassis, according to some embodiments. As indicated at 710 removal of one or more screws of the server chassis is monitored via one or more switches coupled to the server chassis. In some embodiments, the one or more switches may monitor removal of other components of the server chassis, such as an outer wall of the server chassis or other structural member.

As indicated at 720 an evaluation is made whether one or more screws (or other components) of the server chassis have been removed. In some embodiments, the anti-tamper switches may be magnetic switches that are placed underneath screws securing any one of the server chassis walls to detect removal or attempted removal of the screws. In some embodiments, anti-tamper switches may be proximity sensors utilizing other methods of detection such as changes in electrical potential, to detect the removal or attempted removal of the screws (or other components) being monitored by the anti-tamper switches. As indicated at 730, if a determination is made that one or more screws (or other components) of the server chassis have been removed, a signal is sent to a BMC. As indicated at 740, if a determination is made that one or more screws (or other components) of the server chassis have been removed, a signal is sent to a BMC and/or to a security module. In some embodiments, a security module may not provide a correct cryptographic signature to the BMC and/or processors to prevent the server system from booting. As indicated at 760, once a signal is sent to the BMC of removal of screws securing the chassis wall, the server system is prevented from booting and logical access to the server system is denied.

As indicated at 750, if the anti-tamper switches has not detected one or more screws of the server chassis as removed or attempted to be removed, the server system is allowed to boot normally and logical access to the server system is granted.

The methods described herein may in various embodiments be implemented by any combination of hardware and software. For example, in some embodiment, the methods may be implemented by a server system (e.g., a server or a computer system as in FIG. 8) that includes one or more processors executing program instructions stored on a computer-readable storage medium coupled to the processors. The program instructions may implement the functionality described herein (e.g., the functionality of various servers and other components). The various methods as illustrated in the figures and described herein represent example embodiments of methods. The order of any method may be changed, and various elements may be added, reordered, combined, omitted, modified, etc.

Figure 8:
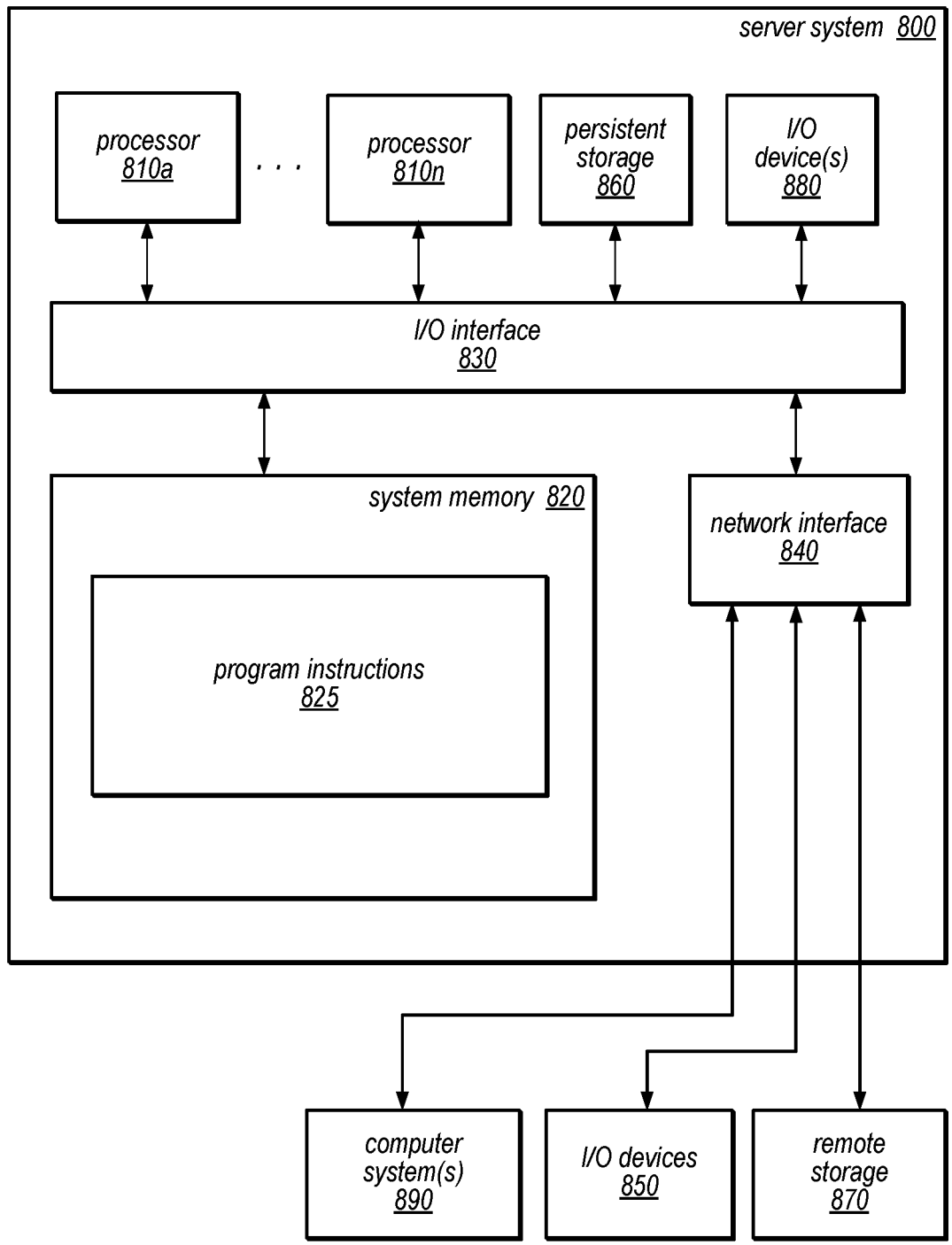
FIG. 8 is a block diagram illustrating an example computer system that may be included in any of the above examples of server systems that allow reversible server Input/Output (IO) orientation and accommodate multiple airflow directions inside the server chassis, according to some embodiments.

FIG. 8 is a block diagram illustrating an example computer or server system that allows reversible server Input/Output (IO) orientation and accommodates multiple airflow directions inside the server chassis, according to various embodiments. Server system 800 includes one or more processors 810 (any of which may include multiple cores, which may be single or multi-threaded) coupled to a system memory 820 via an input/output (I/O) interface 830. Server system 800 further includes a network interface 840 coupled to I/O interface 830. In various embodiments, server system 800 may be a uniprocessor system including one processor 810, or a multiprocessor system including several processors 810 (e.g., two, four, eight, or another suitable number). Processors 810 may be any suitable processors capable of executing instructions. For example, in various embodiments, processors 810 may be general-purpose or embedded processors implementing any of a variety of instruction set architectures (ISAs), such as the x96, PowerPC, SPARC, or MIPS ISAs, or any other suitable ISA. In multiprocessor systems, each of processors 810 may commonly, but not necessarily, implement the same ISA. The server system 800 also includes one or more network communication devices (e.g., network interface 840) for communicating with other systems and/or components over a communications network (e.g. Internet, LAN, etc.). For example, a client application executing on system 800 may use network interface 840 to communicate with a server application executing on a single server or on a cluster of servers that implement one or more of the components of the event bus systems described herein.

In the illustrated embodiment, server system 800 also includes one or more persistent storage devices 860 and/or one or more I/O devices 880. In various embodiments, persistent storage devices 860 may correspond to disk drives, tape drives, solid state memory, other mass storage devices, or any other persistent storage device. Server system 800 (or a distributed application or operating system operating thereon) may store instructions and/or data in persistent storage devices 860, as desired, and may retrieve the stored instruction and/or data as needed. For example, in some embodiments, server system 800 may host a storage system server node, and persistent storage 860 may include the SSDs attached to that server node.

Server system 800 includes one or more system memories 820 that may store instructions and data accessible by processor(s) 810. In various embodiments, system memories 820 may be implemented using any suitable memory technology, (e.g., one or more of cache, static random access memory (SRAM), DRAM, RDRAM, EDO RAM, DDR 10 RAM, synchronous dynamic RAM (SDRAM), Rambus RAM, EEPROM, non-volatile/Flash-type memory, or any other type of memory). System memory 820 may contain program instructions 825 that are executable by processor(s) 810 to implement the methods and techniques described herein. In various embodiments, program instructions 825 may be encoded in platform native binary, any interpreted language such as Java™ byte-code, or in any other language such as C/C++, Java™, etc., or in any combination thereof.

In some embodiments, program instructions 825 may include instructions executable to implement an operating system (not shown), which may be any of various operating systems, such as UNIX, LINUX, Solaris™, MacOS™, Windows™, etc. Any or all of program instructions 825 may be provided as a computer program product, or software, that may include a non-transitory computer-readable storage medium having stored thereon instructions, which may be used to program a server system (or other electronic devices) to perform a process according to various embodiments. A non-transitory computer-readable storage medium may include any mechanism for storing information in a form (e.g., software, processing application) readable by a machine (e.g., a computer). Generally speaking, a non-transitory computer-accessible medium may include computer-readable storage media or memory media such as magnetic or optical media, e.g., disk or DVD/CD-ROM coupled to server system 800 via I/O interface 830. A non-transitory computer-readable storage medium may also include any volatile or non-volatile media such as RAM (e.g. SDRAM, DDR SDRAM, RDRAM, SRAM, etc.), ROM, etc., that may be included in some embodiments of server system 800 as system memory 820 or another type of memory. In other embodiments, program instructions may be communicated using optical, acoustical or other form of propagated signal (e.g., carrier waves, infrared signals, digital signals, etc.) conveyed via a communication medium such as a network and/or a wireless link, such as may be implemented via network interface 840.

In one embodiment, I/O interface 830 may coordinate I/O traffic between processor 810, system memory 820 and any peripheral devices in the system, including through network interface 840 or other peripheral interfaces. In some embodiments, I/O interface 830 may perform any necessary protocol, timing, or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments, some or all of the functionality of I/O interface 830, such as an interface to system memory 820, may be incorporated directly into processor 810.

Network interface 840 may allow data to be exchanged between server system 800 and other devices attached to a network, such as other computer systems 890. In addition, network interface 840 may allow communication between server system 800 and various I/O devices 850 and/or remote storage 870. Input/output devices 850 may, in some embodiments, include one or more display terminals, keyboards, keypads, touchpads, scanning devices, voice or optical recognition devices, or any other devices suitable for entering or retrieving data by one or more server systems 800. Multiple input/output devices 850 may be present in server system 800 or may be distributed on various nodes of a distributed system that includes server system 800. Network interface 840 may commonly support one or more wireless networking protocols (e.g., Wi-Fi/IEEE 902.11, or another wireless networking standard). However, in various embodiments, network interface 840 may support communication via any suitable wired or wireless general data networks, such as other types of Ethernet networks, for example. Additionally, network interface 840 may support communication via telecommunications/telephony networks such as analog voice networks or digital fiber communications networks, via storage area networks such as Fibre Channel SANs, or via any other suitable type of network and/or protocol. In various embodiments, server system 800 may include more, fewer, or different components than those illustrated in FIG. 8 (e.g., displays, video cards, audio cards, peripheral devices, other network interfaces such as an ATM interface, an Ethernet interface, a Frame Relay interface, etc.)

Although the embodiments above have been described in considerable detail, numerous variations and modifications may be made as would become apparent to those skilled in the art once the above disclosure is fully appreciated. It is intended that the following claims be interpreted to embrace all such modifications and changes and, accordingly, the above description to be regarded in an illustrative rather than a restrictive sense.

What is claimed is:

1. A server system, comprising:
a server chassis comprising a front connector on a front face of the chassis and a rear connector on a rear face of the chassis, wherein both the front connector and the rear connector are configured to physically and communicatively couple with a cover for the server system;
one or more fans mounted in the server chassis wherein the fans are configured to direct an airflow through the server chassis; and
a baseboard management controller configured to:
detect whether the cover is connected to the front connector on the front face of the chassis or is connected to the rear connector on the rear face of the chassis; and
cause, based on said detecting, the one or more fans to direct the airflow through the server chassis from the front of the chassis to the rear of the chassis or from the rear of the chassis to the front of the chassis based on whether the cover is connected to the front connector or the rear connector.

2. The server system of claim 1, wherein to cause the one or more fans to direct the airflow through the server chassis from the front of the chassis to the rear of the chassis or from the rear of the chassis to the front of the chassis, the baseboard management controller is further configured to:
provide a control signal that causes a rotational direction of respective blades of the fans to be reversed.

3. The server system of claim 1, further comprising:
one or more fan assemblies housing the one or more fans; and
a mechanical actuator coupled to the one or more fan assemblies,
wherein to cause the fans to direct the airflow through the server chassis from the front of the chassis to the rear of the chassis or from the rear of the chassis to the front of the chassis, the baseboard management controller is further configured to:
provide a control signal to the mechanical actuator to rotate the fans to face a reverse direction.

4. The server system of claim 1, further comprising:
removable mounting fasteners configured to couple with the server chassis wherein the fasteners are configured to couple with the server chassis from the front face of the chassis or the rear face interchangeably.

5. The server system of claim 1, wherein the cover further comprises one or more displays, wherein the displays are configured to provide status information of the server at the front or rear of the server based on which face the cover is connected to.

6. The server system of claim 1, further comprising:
one or more switches coupled to the server chassis wherein the switches are configured to:
detect removal of one or more screws of the server chassis, and
send a signal to the baseboard management controller notifying of the removal of the one or more screws.

7. The server system of claim 1, wherein a data storage of the cover is further configured to:
send to a security module a cryptographic signature; and
wherein the security module verifies the cryptographic signature and prevents the server system from booting upon an incorrect cryptographic signature.

8. The server system of claim 1, further comprising:
a power supply unit comprising one or more fans,
wherein the baseboard management controller is further configured to:
cause, based on the detecting, the one or more fans of the power supply unit to direct the airflow through the server chassis from the front of the chassis to the rear of the chassis or from the rear of the chassis to the front of the chassis based on whether the cover is connected to the front connector or the rear connector.

9. An integrated circuit storing program instructions, that when executed on or across one or more processors of the baseboard management controller, cause the one or more processors to:
detect whether a cover for a server is connected to a front connector on a front face of a server chassis or is connected to a rear connector on a rear face of the chassis, wherein both the front connector and the rear connector are configured to physically and communicatively couple with the cover for the server; and
cause, based on said detecting, one or more fans mounted in the server chassis to direct an airflow through the server chassis from a first direction to a second direction based on whether the cover is connected to the front connector or the rear connector.

10. The integrated circuit of claim 9, wherein to cause the one or more fans to direct the airflow through the server chassis from first direction to the second direction or from the second direction to the first direction, the integrated circuit is further configured to:
provide a control signal that causes a rotational direction of respective blades of the fans to be reversed.

11. The integrated circuit of claim 9, wherein to cause the fans to direct the airflow from the first direction to the second direction, the program instructions, when executed on or across one or more processors of the baseboard management controller, cause the one or more processors to:
provide a control signal to a mechanical actuator to rotate a housing of the one or more fans to face a reverse direction.

12. The integrated circuit of claim 11, wherein the integrated circuit provides the control signal to a plurality of mechanical actuators, wherein respective ones of the mechanical actuators correspond to respective ones of the fans, and wherein the mechanical actuators cause respective housings of the respective ones of the fans to be rotated around respective vertical axis to face the reverse direction.

13. The integrated circuit of claim 11, wherein the integrated circuit provides the control signal to the mechanical actuator that rotates the fans around a horizontal axis to face the reverse direction.

14. The integrated circuit of claim 9, wherein the integrated circuit is configured to:
receive a signal from one or more switches coupled to the server chassis, wherein the switches are configured to detect removal of one or more screws of the server chassis; and
prevent the server from granting access upon receipt of the signal.

15. The integrated circuit of claim 9, wherein the integrated circuit is configured to:

cause, based on the detecting, one or more fans of a power supply unit to direct the airflow through the server chassis from the first direction to the second direction based on whether the cover is connected to the front connector or the rear connector.

16. One or more non-transitory, computer-readable storage media, storing program instructions that when executed on or across one or more computing devices cause the one or more computing devices to implement:

detecting whether a cover for a server is connected to a front connector on a front face of a server chassis or is connected to a rear connector on a rear face of the chassis, wherein both the front connector and the rear connector are configured to physically and communicatively couple with the cover for the server; and causing, based on said detecting, one or more fans mounted in the server chassis to direct an airflow through the server chassis to a particular direction based on whether the cover is connected to the front connector or the rear connector.

17. The one or more non-transitory computer readable media of claim 16, wherein to cause the one or more fans to direct the airflow through the server chassis to a particular direction, the one or more computing devices is further configured to implement:

providing a control signal that causes a rotational direction of respective blades of the fans to be reversed.

18. The one or more non-transitory computer readable media of claim 16, wherein to cause the fans to direct the airflow to a particular direction, the program instructions further cause the one or more computing devices to implement:

providing a control signal to a mechanical actuator to rotate a housing of the one or more fans to face a reverse direction.

19. The one or more non-transitory computer readable media of claim 18, wherein to cause the fans to direct the airflow to a particular direction, the program instructions further cause the one or more computing devices to implement:

providing a control signal to the mechanical actuator to rotate the housing around a vertical axis.

20. The one or more non-transitory computer readable media of claim 18, wherein to cause the fans to direct the airflow to a particular direction, the program instructions further cause the one or more computing devices to implement:

providing a control signal to the mechanical actuator to rotate the housing around a horizontal axis.

\* \* \* \* \*